US011227768B2

(12) United States Patent
Simmons et al.

(10) Patent No.: US 11,227,768 B2
(45) Date of Patent: Jan. 18, 2022

(54) METHOD FOR SELECTIVE INCORPORATION OF DOPANT ATOMS IN A SEMICONDUCTIVE SURFACE

(71) Applicant: NewSouth Innovations Pty Ltd, Kensington (AU)

(72) Inventors: Michelle Simmons, Kensington (AU); Joris Keizer, Kensington (AU)

(73) Assignee: NewSouth Innovations Pty Ltd, Kensington (AU)

( * ) Notice: Subject to any disclaimer, the term of this patent is extended or adjusted under 35 U.S.C. 154(b) by 0 days.

(21) Appl. No.: 17/051,739

(22) PCT Filed: May 2, 2019

(86) PCT No.: PCT/AU2019/050406
§ 371 (c)(1),
(2) Date: Oct. 29, 2020

(87) PCT Pub. No.: WO2019/210370
PCT Pub. Date: Nov. 7, 2019

(65) Prior Publication Data
US 2021/0242022 A1    Aug. 5, 2021

(30) Foreign Application Priority Data

May 2, 2018   (AU) .............................. 2018901480

(51) Int. Cl.
*H01L 21/223*   (2006.01)
*H01L 21/225*   (2006.01)
(52) U.S. Cl.
CPC ........ *H01L 21/223* (2013.01); *H01L 21/2252* (2013.01)

(58) Field of Classification Search
None
See application file for complete search history.

(56) References Cited

U.S. PATENT DOCUMENTS 7,097,708 B2 * 8/2006 Clark ..................... B82Y 10/00
117/94
2004/0244672 A1 12/2004 Clark et al.

FOREIGN PATENT DOCUMENTS

WO   2002018266 A1   3/2002
WO   2005019095 A1   3/2005

OTHER PUBLICATIONS

International Search Report and Written Opinion for PCT/AU2019/050406, dated Jul. 15, 2019.

(Continued)

*Primary Examiner* — Andres Munoz
(74) *Attorney, Agent, or Firm* — Polsinelli PC (57) ABSTRACT

The present disclosure is directed to a methodology for embedding a deterministic number of dopant atoms in a surface portion of a group IV semiconductor lattice. The methodology comprises the steps of: forming one or more lithographic sites on the surface portion; dosing, at a temperature below 100 K, the surface portion using a gas with molecules comprising the dopant atom and hydrogen atoms in a manner such that, a portion of the molecules bonds to the surface portion; and incorporating one or more dopant atoms in a respective lithographic site by transferring an amount of energy to the dopant atoms. The number of dopant atoms incorporated in a lithographic site is deterministic and related to the size of the lithographic site.

20 Claims, 6 Drawing Sheets

(56) References Cited

OTHER PUBLICATIONS

Fuechsle M. et al. "A single-atom transistor", Nature Nanotechnology, 2012, vol. 7, No. 12, pp. 242-246.
Ruess, F. J. et al. "Toward Atomic-scale device fabrication in Silicon using scanning probe microscopy", Nano Letters, (2004), vol. 4, No. 10, pp. 1969-1973.
Schofield S. R. et al., "Phosphine dissociation and diffusion on Si(001) observed at the atomic scale", Journal of Physical Chemistry B., 2006, vol. 110, pp. 3173-3179.

* cited by examiner

METHOD FOR SELECTIVE INCORPORATION OF DOPANT ATOMS IN A SEMICONDUCTIVE SURFACE

CROSS-REFERENCE TO RELATED APPLICATIONS

This application is a national stage entry number PCT/AU2019/050406 filed May 2, 2019, which claims priority to AU application number 2018901480 filed May 2, 2018, said application is expressly incorporated herein by reference in its entirety.

FIELD OF THE INVENTION

The present invention relates to a method for incorporating dopant atoms in a semiconductive surface. In particular, the present invention relates to a method for deterministically incorporating dopants from a gaseous source in a semiconductor crystal.

BACKGROUND OF THE INVENTION

A promising pathway towards building an error corrected quantum computing circuit requires leveraging the quantum properties of single donor atoms embedded in the crystal lattice of a semiconductor to create qubits. This approach involves atom-by-atom fabrication of donor structures in silicon and requires atomic precision.

U.S. Pat. No. 7,097,708, which is incorporated herein by reference, describes a technique to incorporate atoms in silicon by growing silicon over a doped surface, after desorbing the passivating hydrogen. A scanning tunnelling microscope (STM) is used to locally remove hydrogen from a passivated Si(001) surface, followed by dosing with gaseous phosphine, and subsequent encapsulation by silicon molecular beam epitaxy. After the dosing, and before the encapsulation, a thermal anneal is performed to incorporate the dopant atoms into the surface.

In order to manufacture a large error-corrected quantum computing circuit using this approach, it is important that the dopant incorporation process is reproducible, and the number of incorporated atoms can be decided deterministically for each lithographic site. Although single dopant devices have been demonstrated, the probabilistic nature of the phosphorus incorporation process hinders the scale-up to architectures with a large number of single donor qubits using current technology.

SUMMARY OF THE INVENTION

Embodiments of the invention are related to a scalable approach for manufacturing a large error-corrected quantum computing circuit that circumvents the probabilistic nature of dopant absorption and dissociation, allowing to deterministically incorporate one or more dopant atoms at specific locations into silicon.

In accordance with the first aspect, the present invention provides a method for embedding a deterministic number of dopant atoms in a surface portion of a group IV semiconductor lattice, the method comprising the steps of:
a) forming one or more lithographic sites on the surface portion;
b) dosing, at a temperature below 100 K, the surface portion using a gas with molecules comprising the dopant atom and hydrogen atoms in a manner such that, a portion of the molecules bonds to the surface portion; and
c) incorporating one or more dopant atoms in a respective lithographic site by transferring an amount of energy to the dopant atoms;
wherein the number of dopant atoms incorporated in a lithographic site is deterministic and related to the size of the lithographic site.

In embodiments, while some of the dopant atoms are incorporated in their respective lithographic site, atoms that are not incorporated are released from the surface portion. In embodiments, the surface portion of a group IV semiconductor lattice is a pure crystalline silicon portion.

In embodiments, the molecules in the dosing gas contain phosphine ($PH_3$) and the dosing process is performed in a manner such that the surface portion is saturated with $PH_3$ molecules and only $PH_3$ molecules are absorbed and bond with the surface portion at the lithographic sites.

In some embodiments, the dosing process is performed at a temperature such that dissociation of $PH_3$ into $PH_2$ is prevented, for example below 40K. In alternative embodiments, the dosing process is performed at a temperature such that dissociation of $PH_3$ into $PH_2$ occurs spontaneously, for example 77K.

The lithographic sites can have different configurations. For example, the sites can be 1 by 1 silicon atomic sites, 2 by 1 silicon dimer patches, 3 by 1 silicon dimer patches, 4 by 1 silicon dimer patches or 5 by 1 silicon dimer patches. In some instances, the lithographic sites can be 2 by 2 silicon dimer patches, 3 by 2 silicon dimer patches, 4 by 2 silicon dimer patches or 5 by 2 silicon dimer patches. The lithographic sites can also have other configurations.

By using the methodology disclosed herein, the number of atoms incorporated in each lithographic site only depends on the size and configuration of the lithographic site and can be controlled in a deterministic manner.

In some embodiments, the lithographic sites are 3 by 1 silicon dimer patches and the step of incorporating one or more dopant atoms in a respective lithographic site comprises the step of annealing the surface portion in a manner such that single dopant atoms from a first portion of the bonded molecules are incorporated in respective lithographic sites in the surface portion; and a second portion of the bonded molecules is released from the surface portion.

Each 3 by 1 silicon dimer may bond with six $PH_3$ molecules. The bonded $PH_3$ molecules may lose one hydrogen atom during bonding. During the step of annealing, $PH_2$ molecules bond with an additional hydrogen atom and are released from the surface portion.

In embodiments, the step of annealing the surface portion is performed in two phases: a first phase during which the bonded $PH_3$ molecules lose one hydrogen atom to form a plurality of $PH_2$ molecules bonded to the surface; a second phase during which the bonded $PH_2$ molecules lose their two hydrogen atoms to other $PH_2$ molecules and a single P atom is embedded in a single 3 by 1 silicon dimer patch.

The surface configuration with a plurality of $PH_2$ bonded molecules is energetically favoured over the configuration with $PH_3$ molecules bonded to the surface.

A bond strength between the $PH_2$ molecules and the silicon atoms of the surface portion may be higher than the bond strength between the $PH_3$ molecules and the silicon atoms of the surface portion.

The first annealing phase may be performed by, for example, removing the sample for a period of time from the deposition environment and exposing it to room temperature. The second annealing phase may be performed using rapid thermal annealing (RTA) at a temperature comprised between 200° C. and 400° C.

In embodiments, alternatively to performing annealing steps, the incorporation of one or more dopant atoms in the respective lithographic site is performed by positioning a tip of a scanning tunnelling microscope above one of the molecules and transferring an amount of energy to the dopant atoms through the tip.

In embodiments, the energy to the dopant atoms is provided by applying a current to the dopant atoms and the semiconductor surface through the scanning tunnelling microscope tip while the tip is positioned in proximity of the dopant atom.

In an embodiment, in order to apply the current through the tip, a feedback control loop of the scanning tunnelling microscope is deactivated and, to increase the magnitude of the current, the tip is controlled to move closer to the dopant atom. The magnitude of the applied current can be monitored for sharp variations triggered by incorporation of a dopant atom. The magnitude of the current may be between 0.1 nA and 10 nA.

In an embodiment, the method comprises applying a voltage between the tip and the semiconductor surface, the voltage having a magnitude between 2V and 4V.

In alternative embodiments, in order to transfer an amount of energy to the dopant atoms, a voltage or current is applied to the dopant atoms and the semiconductor surface through the tip while the feedback control loop of the scanning tunnelling microscope is active. The distance between the tip and the dopant atom can be monitored for sharp variations triggered by incorporation of a dopant atom while the magnitude of the current is increased. The initial distance between the tip and the atom is between 0.1 nm and 10 nm.

In other embodiments, in order to transfer an amount of energy to the dopant atoms, a voltage pulse with a duration between 0.1 s and 1 s and a magnitude between 2V and 4V or a current pulse with a duration between 0.1 s and 1 s and a magnitude between 0.1 nA and 1 nA is applied to the dopant atoms and the semiconductor surface through the tip.

Advantageously, in accordance with embodiments of the invention, a deterministic number of donor atoms is incorporated in the semiconductor surface by providing uniform dosing across the surface at low temperature. Donor atoms can be incorporated in respective lithographic sites deterministically and the number of incorporated atoms is only related to the size and configuration of the lithographic site.

Furthermore, dopant atoms, atoms can be incorporated in the semiconductor surface by a series of chemical reactions driven by temperature or scanning tunnelling microscope tip assisted incorporation.

For example, in the case of phosphorus atom incorporated in silicon using phosphine ($PH_3$), the absorbed $PH_3$ molecules dissociate simultaneously into $PH_2$, then PH and ultimately P and, by applying low temperature dosing and using 3 by 1 dimer patches.

In contrast, when dosing at room temperature, $PH_3$ can dissociate uncontrollably into $PH_2$ and then PH as there is enough energy in the surrounding environment to overcome the associated energy barriers before performing the annealing process. This can result in a random starting configuration of $PH_x$ (x=1,2) molecules within the lithographic patch and thus a random outcome of number of donors incorporated.

BRIEF DESCRIPTION OF THE DRAWINGS

Features and advantages of the present invention will become apparent from the following description of embodiments thereof, by way of example only, with reference to the accompanying drawings, in which.

DETAILED DESCRIPTION OF EMBODIMENTS

In the following description a method for deterministically incorporating atoms, such as dopant atoms like phosphorus, in a semiconductor crystal in accordance with embodiments is described.

The term "annealing" as used herein refers to the process of increasing the temperature of the sample. In some instances, the temperature may be increased by positively applying heat using a heat source such as a lamp, a current, or a furnace. Annealing may also be performed by taking the sample out of the cooled environment (cryostat) to a room temperature environment for a period of time to allow the temperature of the sample to increase.

Figure 1A:
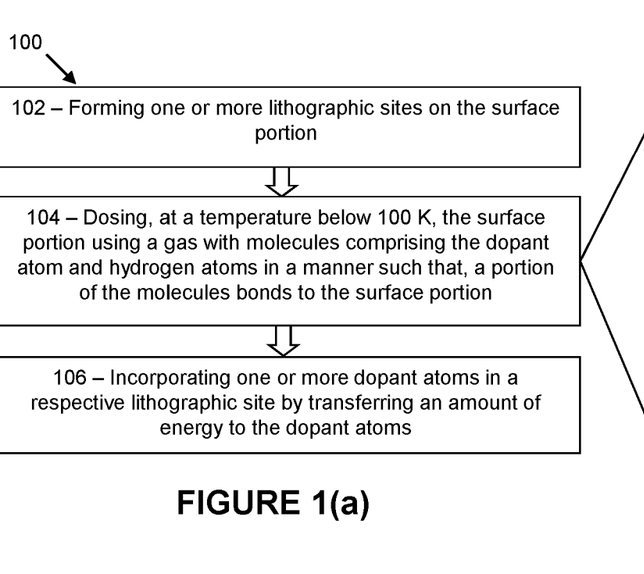
FIG. 1 shows a flow diagram with steps to perform a method for embedding a dopant atom in a surface portion of a group IV semiconductor lattice.

Referring now to FIG. 1, there is shown a flow diagram 100 with the steps used to deterministically incorporate one or more phosphorus atoms in respective lithographic sites in a surface portion of a pure crystalline silicon lattice.

The surface, for example, can be a Si(100) 2×1 reconstructed surface. Such silicon surface initially shows a 1 by 1 square array of surface Si atoms. Each of these has two dangling bonds remaining from the diamond structure, creating a surface that can be reconstructed into a lower-energy structure. The observed reconstruction has a 2×1 periodicity, explained by the formation of dimers, which consist of paired surface atoms, decreasing the number of dangling bonds by a factor of two and leaving one dangling bond per surface Si atom. The Si(001) 2×1 surface is terminated with hydrogen atoms which are selectively removed using the lithographic properties of a scanning tunnelling microscope (STM) to form a 'lithographic mask' (step 102).

The surface portion is then dosed with phosphine ($PH_3$) at a temperature below 100 K (step 104). The dosing is performed so that the surface portion is saturated with $PH_3$ molecules and a portion of the molecules bond to group IV atoms of the surface portion. Importantly, only $PH_3$ molecules are absorbed and bond with the silicon lattice at the exposed silicon lithographic sites. Each 3 by 1 dimer patch may bond with six $PH_3$ molecules.

The absorption of gaseous $PH_3$ to a dimer site is not affected by the low temperature as there is no energy barrier associated with this process. The end configuration ($PH_3$ absorbed) is found to be 0.62 eV more stable than gas-phase $PH_3$ and the bare silicon surface.

On the other hand, other dissociation steps of the $PH_x$ molecule are governed by energy barriers and their reaction rates can be described using an Arrhenius equation. This means that the dissociation process is expected to slow down considerably and effectively stopped when the temperature is sufficiently lowered.

In accordance with the present invention, the inventors have designed a dosing process that prevents the dissociation of $PH_3$ during dosing by reducing the energy available in the surrounding environment in order to provide a silicon surface completely terminated with $PH_2$ before performing phosphorus incorporation.

Another advantage provided by the low temperature dosing process described herein is that STM hydrogen lithography at the sub-nm scale has proven to be more reliable at low temperature. The low temperature allows for increased tip stability and reduced thermal drift.

Another advantage of the low temperature used in the dosing process is the increased hydrogen desorption rate due to the increased vibrational lifetime of the Si—H bond at low temperature and reduced tunnel current, which in turn increases the tip and lithographic stability even further.

Figure 1B:
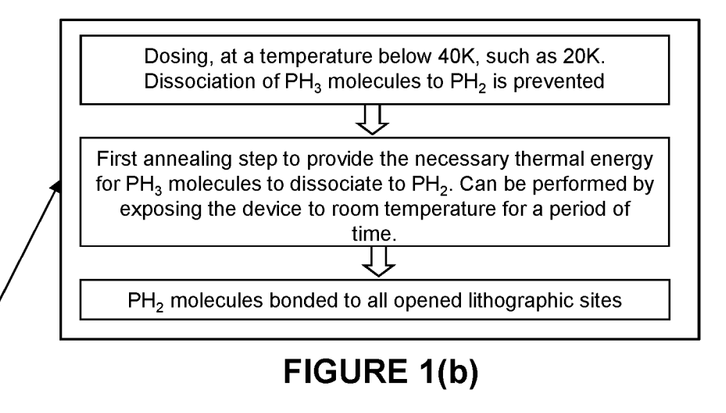
Figure 1C:
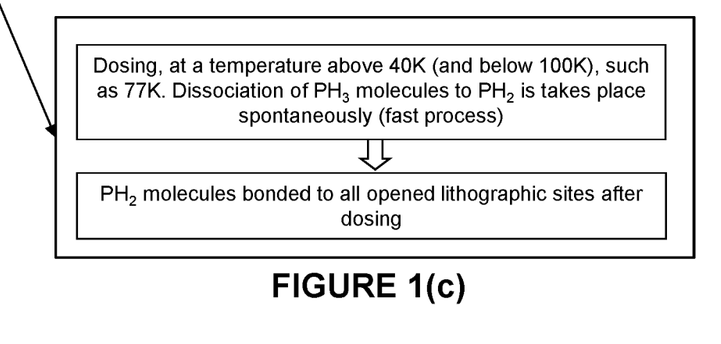

FIG. 1(b) and FIG. 1(c) show flow diagrams outlining the dosing process in two different instances. In the process shown in FIG. 1(b), dosing is performed at temperatures below 40K, for example 20K. In this case, the dissociation of $PH_3$ molecules to $PH_2$ is prevented as there is not enough thermal energy in the dosing environment to allow for the dissociation. In order to allow for $PH_3$ molecules to dissociate, a first annealing step can be performed to provide the necessary thermal energy for $PH_3$ molecules to dissociate to $PH_2$. This may be done, for example, by extracting the sample from the cooled deposition environment. At room temperature, enough thermal energy is available for the first portion of the bonded molecules to lose one hydrogen atom and dissociate to $PH_2$ molecules bonded to the surface. Any further dissociation of the $PH_2$ molecules to PH or P is prevented due to the lack of bare silicon sites at this point in the process.

In other instances, dosing is performed at a temperature above 40K, for example liquid nitrogen temperature (77K). In this case, the $PH_3$ molecules have sufficient energy to dissociate to $PH_2$ during the dosing step and, after dosing, only $PH_2$ molecules are bonded to the available sites on the semiconductive surface.

Once the $PH_2$ molecules are bonded to all opened lithographic sites, depending on the size and configuration of the sites, single phosphorus atoms can be incorporated by transferring an amount of energy to the dopant atoms in proximity of the lithographic sites by thermal annealing or STM tip assisted incorporation (step 106). By using this process, the number of dopant atoms incorporated in each lithographic site is deterministic and related to the size of the lithographic site.

Figure 2:
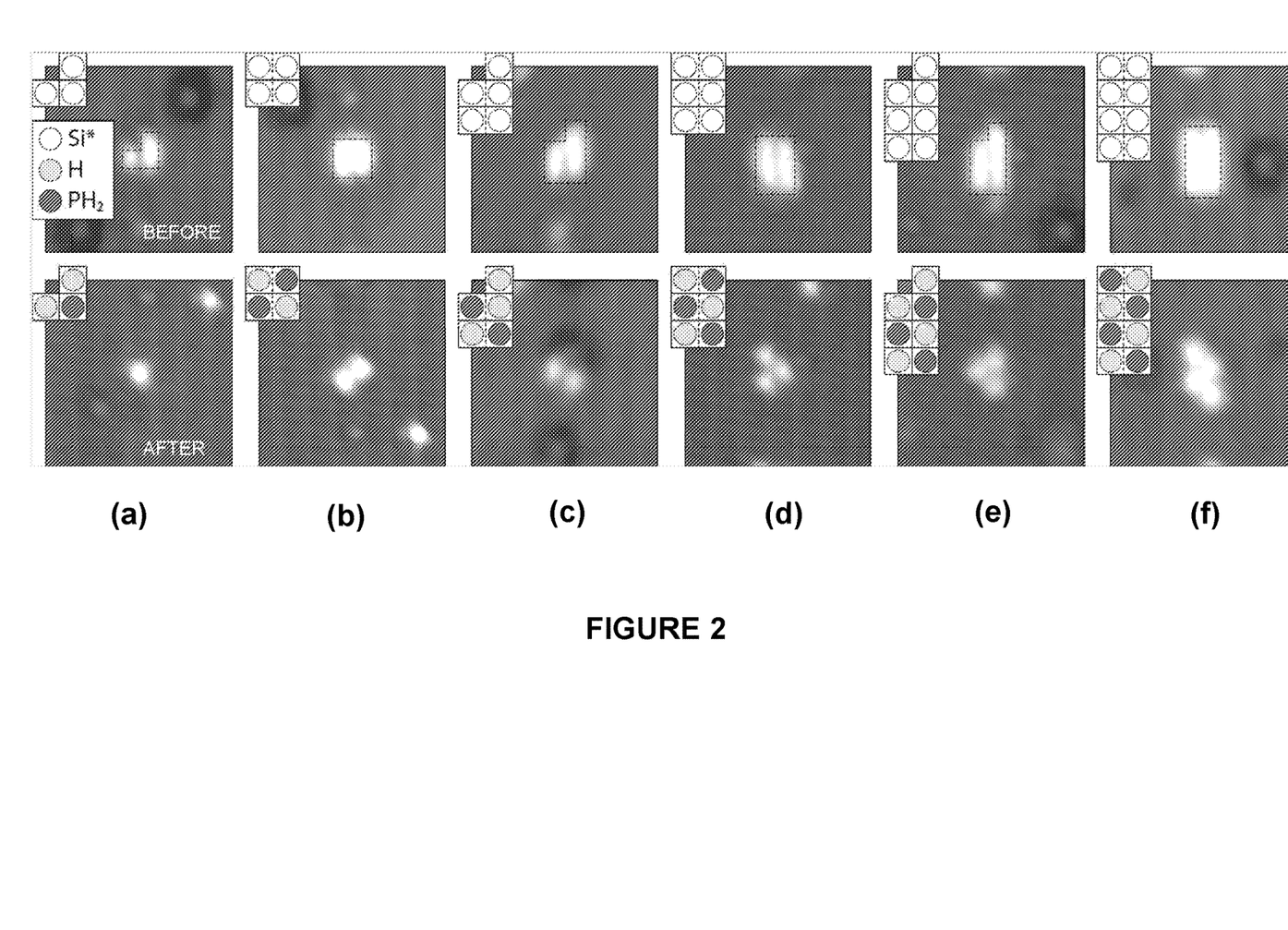
FIG. 2 shows a series of images of lithographic sites of different size and shape before and after dosing.

Referring now to FIG. 2, there are shown several examples of lithographic sites of different size and shape before and after dosing at 77K. FIG. 2(a), for example, shows a lithographic site that includes 3 available bonding locations, a single $PH_2$ molecule bonds to this site during dosing. The single phosphorus atom can be incorporated from the single module into the surface by STM tip assisted incorporation.

FIG. 2(b) shows a lithographic site with two dimers that allows two $PH_2$ molecules to bond. Two $PH_2$ molecules can also bond to the site of FIG. 2(c), whist the 3×1 dimers site of FIG. 2(d) and the site of FIG. 2(e) allow for three $PH_2$ molecules to bond. Four $PH_2$ molecules can bond to the site shown in FIG. 2(f). Phosphorus atoms can be incorporated in the sites shown in FIG. 2(d-f) using a series of chemical reactions triggered by temperature as discussed below.

For example, in the case of FIG. 2(d), the $PH_3$ dosed silicon surface comprising a plurality of 3×1 lithographic sites is annealed in a manner such that single phosphorus atoms from the bonded $PH_3$ molecules are incorporated in each site. The remaining portion of the phosphorus atoms (which are not incorporated) and remaining $PH_3$ molecules are subsequently desorbed from the surface.

Figure 3:
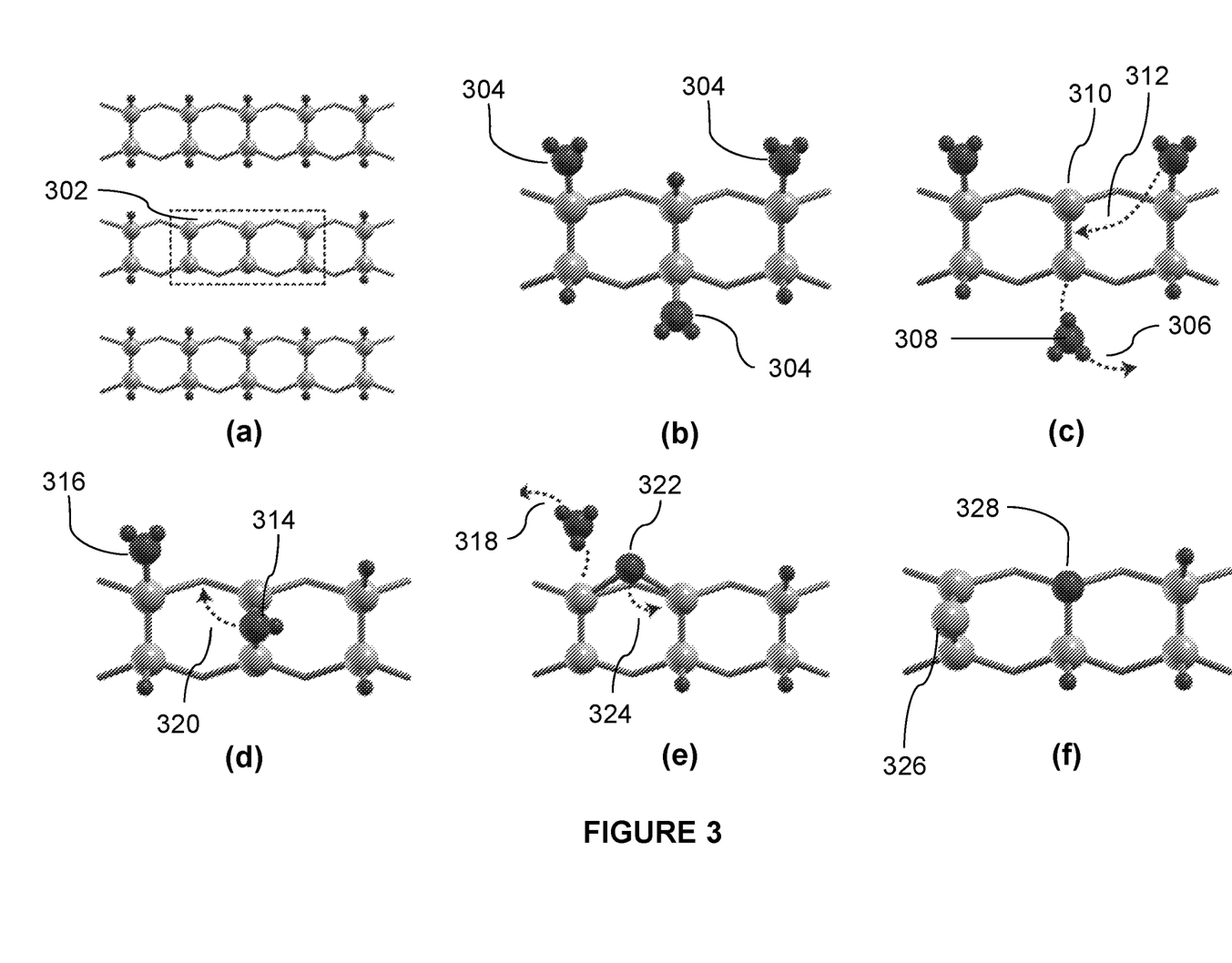
FIG. 3 shows schematic representations of hydrogen lithography and chemical reactions used to deterministically incorporate a single phosphorus atom into a silicon crystalline surface.

Referring now to FIG. 3(a), there is shown an example of a hydrogen terminated silicon surface with a 3 by 1 silicon dimer patch 302 formed by STM lithography. Theoretical research has shown that a minimum of three adjacent bare silicon dimers sites in a hydrogen mask are necessary to incorporate one phosphorus atom from the adsorbed $PH_3$ molecules using an annealing technique. Due to the strong anisotropy of movement of atoms on the reconstructed Si(001) surface the three dimers need to be oriented along one dimer row, as shown in FIG. 3(a).

FIG. 3(b) shows the $PH_2$ molecules 304 bonded to the surface in a configuration which is energetically favoured over a configuration of $PH_3$ molecules bonded to the surface. At room temperature the thermal energy is sufficient to overcome the dissociation reaction energy barrier.

FIGS. 3(c) to 3(f) show steps occurring during the second annealing phase. $PH_2$ molecules 304 bond with an additional hydrogen atom and are released 306 from the surface portion as $PH_3$ 308. The free silicon site left by this desorption 310 enables the immediate dissociation 312 of a $PH_2$ in to PH 314. The remaining $PH_2$ 316 can then recombine with H and desorb as $PH_3$ 318 creating another free site before the PH 314 can dissociate into atomic phosphorus 320. Finally, the phosphorus atom 322 incorporates into the silicon surface layer 324 ejecting a silicon atom in the process 326.

Through the process described above with reference to FIG. 3, a single phosphorus atom 328 is embedded in a single 3 by 1 silicon dimer patch.

The methodology designed by the inventors allows the preparation of a patterned silicon surface deterministically terminated with $PH_2$ molecules as all $PH_3$ molecules dissociate simultaneously into $PH_2$. In turn, such a surface allows deterministic incorporation of a P atom into a respective silicon 3 by 1 dimer patch.

In some embodiments, the single donor incorporation process described above can be used to fabricate quantum dots that comprise a plurality of phosphorus atoms. Each of these quantum dots can be used as a quantum bit to encode quantum information.

Figure 4:
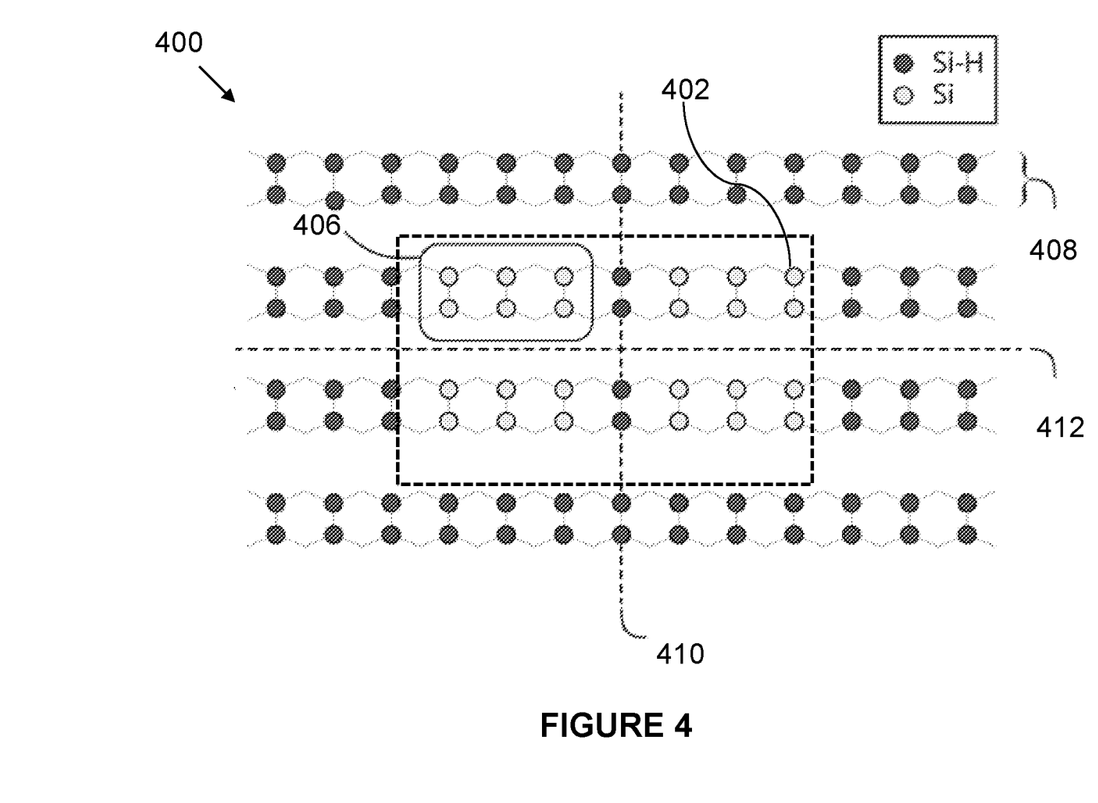
FIG. 4 is a top view of a hydrogen terminated silicon surface used to form a donor qubit with four donor atoms.

Referring now to FIG. 4, there is shown a silicon surface 400 comprising a quantum bit 402 with four donor atoms embedded in four adjacent dimer patches 406 using the method described herein. The 3 by 1 dimer patches 406 of bare silicon are separated by a dimer 408 of hydrogen terminated silicon along the dimer rows and by the surface topography of the 2×1 surface reconstruction perpendicular to the dimer rows 410. In this way the patches 406 can be considered isolated from each other and each one will eventually host one phosphorus atom. The distance between the patches is sufficiently small so that the individual phosphorus atoms are in substance part of the same quantum bit. This technique can be extended to generate a quantum bit comprising any pre-determined donor number.

Figure 5:
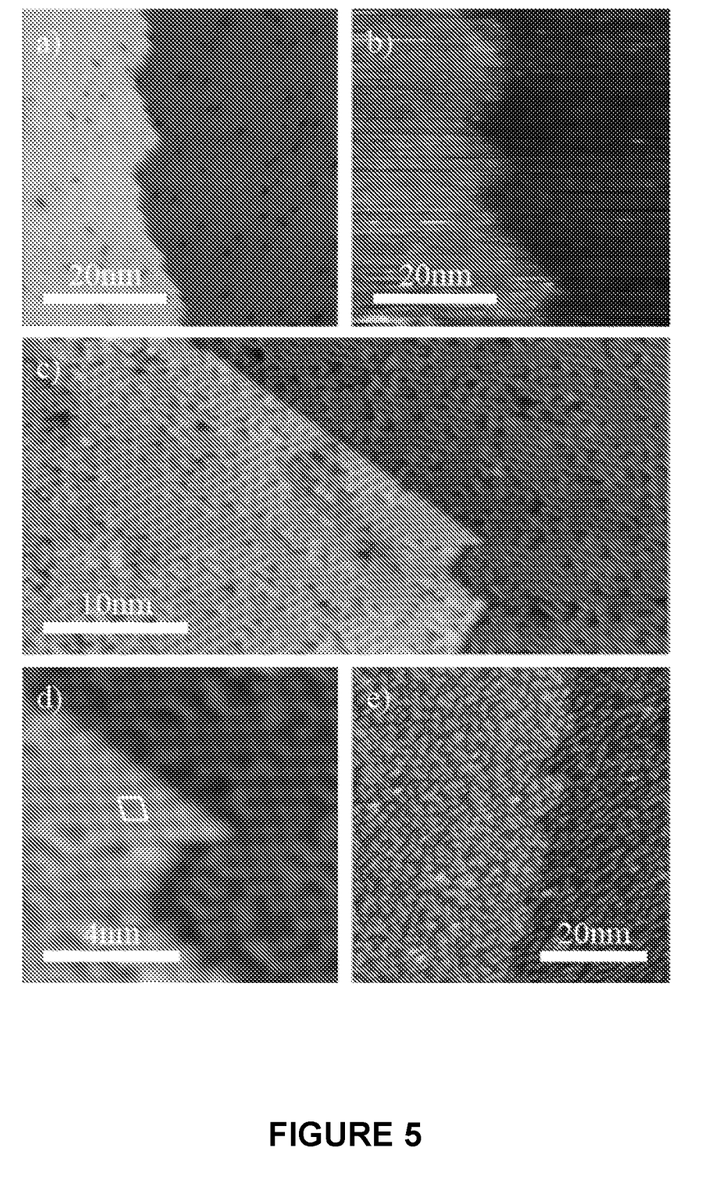
FIG. 5 shows scanning tunnelling micrographs of the various steps of the low-temperature $PH_3$ dosing.

FIG. 5 shows scanning tunnelling micrographs at different stages of the $PH_3$ dosing process performed at 20K. The bare Si (001) 2×1 reconstructed surface is first cooled down to 20K. FIG. 5(a) shows the initial silicon surface, the dimer reconstruction and some surface vacancies (dark depressions).

FIG. 5(b) shows an STM image of the dosed PH$_3$ saturated surface. A substantial change in image conditions is observed. The degradation in image quality is attributed to the adsorbed molecular PH$_3$, which may alter the electronic properties of the surface.

FIG. 5(c) shows the surface of the sample after the sample has been brought to room temperature by removing it from the cold STM-stage by means of a wobble stick that is at room temperature. After a few minutes the sample is inserted back into the cold STM-stage and allowed to cool back down to below 77 K. FIG. 5(c) shows that the image quality has returned to what is expected for a stable Si—PH$_x$ surface configuration. No PH$_x$ species, other than PH$_2$, are observed on the surface. A complete surface cover of PH$_2$ of half a monolayer is observed.

FIG. 5(d) is a close-up of FIG. 5(c). In FIG. 5(d), a p(2×2) surface reconstruction typically found on saturation dosed surfaces with high PH$_2$ fractions can be observed.

FIG. 5(e) shows the surface of the sample after the sample has been annealed at 350° C. to incorporate the PH$_2$ into the surface, in line with the steps shown in FIG. 5(b) to FIG. 5(f). In FIG. 5(e), the ejected silicon is clearly visible as a bright protrusion on the surface.

Referring now to FIG. 6, there is shown a schematic representation of an alternative technique that can be used to incorporate phosphorus atoms from a PH$_2$ dosed surface. For example, in the case of a lithographic site with a single PH$_2$ bonded molecule, like the one of FIG. 2(a), a single phosphorus atom can be incorporated in the site by using an STM tip assisted incorporation technique. The two H atoms also separate from the P atom, which is then incorporated by forming a monohydride.

Figure 6A:
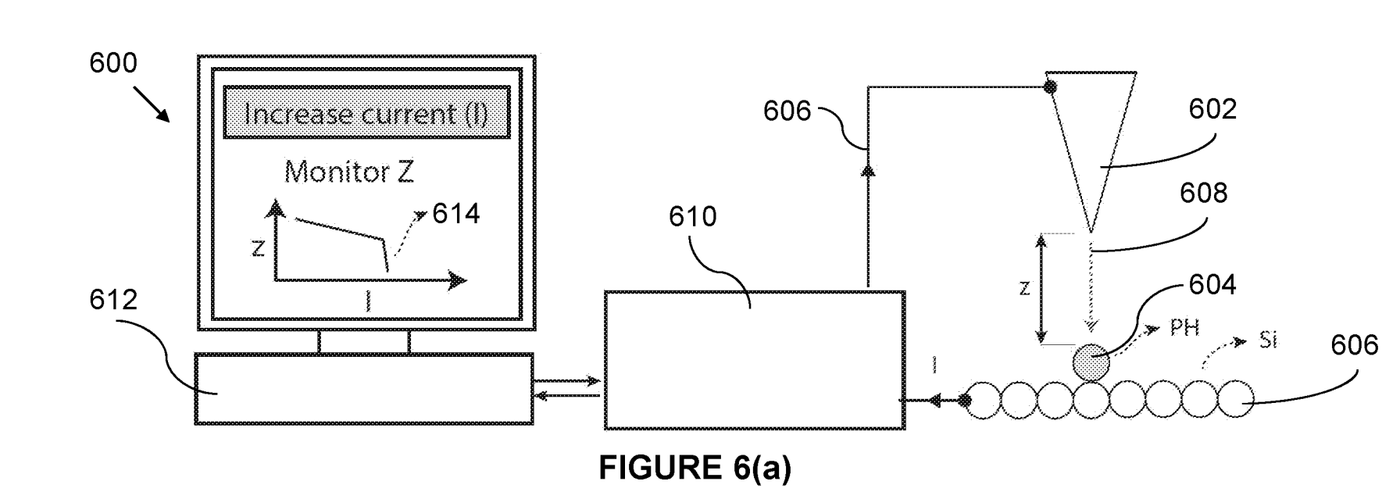
FIG. 6 schematically shows scanning tunnelling microscope tip assisted donor atom incorporation.

In FIG. 6(a), the tip of the STM 602 is positioned above the phosphorus atom to be incorporated 604 in proximity of the lithographic site 606. A current 608 between 0.1 nA and 10 nA is sent through the tip 602 while the STM control feedback loop 610 is kept active. The energy transferred by the current 608 to the phosphorus atom causes the atom to break from the PH$_2$ molecule and bond with the silicon surface.

The initial distance between the tip and the atom is between 0.1 nm and 10 nm. The STM computer system 612 monitors the distance between the tip and the dopant atom for sharp variations 614 triggered by incorporation of the dopant atom while the magnitude of the current is increased. When the sharp variation is detected, the system considers the atom to be incorporated and switches back to imaging mode.

Figure 6B:
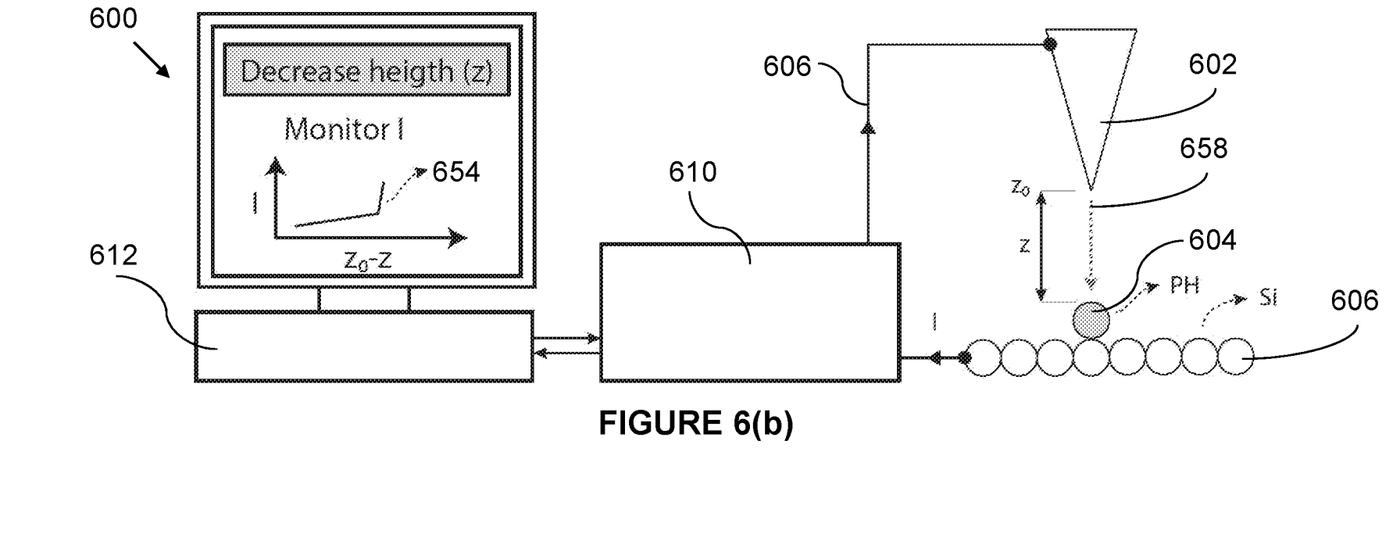

FIG. 6(b) schematically shows an alternative technique that requires deactivating the STM control feedback loop 610 and applying a current 658 between 0.1 nA and 10 nA through the tip 602. To increase the magnitude of the current, the tip is controlled by the STM computer system 612 to move closer to the dopant atom 604. The magnitude of the current can be monitored for sharp variations 654 triggered by incorporation of a dopant atom. A voltage between 2V and 4V can be applied between the tip 602 and the silicon surface to facilitate incorporation.

The STM computer system 612 monitors the magnitude of the current in the tip 602 for sharp variations triggered by incorporation of the dopant atom. When the sharp variation is detected, the system considers the atom to be incorporated and switches back to imaging mode.

In some instances, the systems of FIG. 6 can use a voltage pulse with a duration between 0.1 s and 1 s and a magnitude between 2V and 4V or a current pulse with a duration between 0.1 s and 1 s and a magnitude between 0.1 nA and 1 nA to facilitate the incorporation of the phosphorus atom.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for embedding a deterministic number of dopant atoms in a surface portion of a group IV semiconductor lattice, the method comprising the steps of:
   a) forming one or more lithographic sites on the surface portion;
   b) dosing, at a temperature below 100 K, the surface portion using a gas with molecules comprising the dopant atoms and hydrogen atoms in a manner such that, a portion of the molecules bonds to the surface portion; and
   c) incorporating one or more of the dopant atoms in a respective lithographic site of the one or more lithographic sites by transferring an amount of energy to the dopant atoms;
   wherein the number of the dopant atoms incorporated in the respective lithographic site is deterministic and related to a size of the respective lithographic site.

2. The method of claim 1, wherein the surface portion of the group IV semiconductor lattice is a pure crystalline silicon portion or a pure crystalline germanium portion.

3. The method of claim 1, wherein, during incorporating, the dopant atoms that are not incorporated in the respective lithographic site are released from the surface portion.

4. The method of claim 1, wherein the molecules in the dosing gas contain phosphine (PH$_3$) and the dosing process is performed in a manner such that the surface portion is saturated with PH$_3$ molecules.

5. The method of claim 1, wherein the dosing process is performed in a manner such that only PH$_3$ molecules are absorbed and bond with the surface portion at the one or more lithographic sites.

6. The method of claim 1, wherein the dosing process is performed at a temperature such that dissociation of PH$_3$ into PH$_2$ is prevented, wherein the dosing process is performed at a temperature below 40K, or at a temperature between 40K and 100K, or at a temperature of 77K.

7. The method of claim 1, wherein the dosing process is performed at a temperature such that dissociation of PH$_3$ into PH$_2$ occurs spontaneously.

8. The method of claim 1, wherein the one or more lithographic sites are: 1 by 1 silicon atomic sites, 2 by 1 silicon dimer patches, 3 by 1 silicon dimer patches, 4 by 1 silicon dimer patches, or 5 by 1 silicon dimer patches.

9. The method of claim 1, wherein the one or more lithographic sites are 3 by 1 silicon dimer patches and the step of incorporating the one or more of the dopant atoms in the respective lithographic site comprises a step of annealing the surface portion in a manner such that a single dopant atoms from a first portion of bonded molecules are incorporated in the respective lithographic site in the surface portion; and a second portion of the bonded molecules is released from the surface portion, wherein each dimer patch bonds with six PH$_2$ molecules.

10. The method of claim 9, wherein during the step of annealing, the bonded molecules lose one hydrogen atom, or wherein during the step of annealing, $PH_2$ molecules bond with an additional hydrogen atom and are released from the surface portion.

11. The method of claim 9, wherein the step of annealing the surface portion is performed in two phases:
   i. a first phase during which the bonded molecules lose one hydrogen atom to form a plurality of $PH_2$ molecules bonded to the surface portion, wherein the first annealing phase is performed by exposing the surface portion to room temperature;
   ii. a second phase during which the bonded molecules lose their two hydrogen atoms to other $PH_2$ molecules and a single P atom is embedded in a single 3 by 1 silicon dimer patch, wherein the second annealing phase is performed between 200° C. and 400° C.

12. The method of claim 1, wherein the step of incorporating the one or more dopant atoms in the respective lithographic site comprises a step of positioning a tip of a scanning tunnelling microscope above one of the molecules and transferring an amount of energy to the dopant atoms through the tip.

13. The method of claim 12, wherein the step of transferring the amount of energy to the dopant atoms comprises applying a current to the dopant atoms and the surface portion of the group IV semiconductor lattice through the tip while the tip is positioned in proximity of the dopant atoms, wherein in order to apply the current through the tip, a feedback control loop of the scanning tunnelling microscope is deactivated and, to increase a magnitude of the current, the tip is controlled to move closer to the dopant atoms.

14. The method of claim 13, further comprising monitoring the magnitude of the applied current for sharp variations triggered by incorporation of the one or more dopant atoms.

15. The method of claim 13, wherein the magnitude of the current is between 0.1 nA and 10 nA.

16. The method of claim 13, further comprising applying a voltage between the tip and the surface portion of the group IV semiconductor lattice, the voltage having a magnitude between 2V and 4V.

17. The method of claim 12, wherein the step of transferring the amount of energy to the dopant atoms comprises applying a voltage or current to the dopant atoms and the surface portion of the group IV semiconductor lattice through the tip while a feedback control loop of the scanning tunnelling microscope is active.

18. The method of claim 17, comprising increasing a magnitude of the current and monitoring a distance between the tip and the dopant atoms for sharp variations triggered by incorporation of theft dopant atoms.

19. The method of claim 18, wherein the step of transferring the amount of energy to the dopant atoms comprises applying a voltage pulse with a duration between 0.1 s and 1 s and a magnitude between 2V and 4V, or wherein the step of transferring the amount of energy to the dopant atoms comprises applying a current pulse with a duration between 0.1 s and 1 s and a magnitude is between 0.1 nA and 1 nA.

20. The method of claim 17, wherein a distance between the tip and the dopant atoms is between 0.1 nm and 10 nm.

* * * * *